US009142789B2

(12) United States Patent
Benwadih

(10) Patent No.: US 9,142,789 B2
(45) Date of Patent: Sep. 22, 2015

(54) PHOTODIODE DEVICE CONTAINING A CAPACITOR FOR CONTROLLING DARK CURRENT OR LEAKAGE CURRENT

(75) Inventor: Mohamed Benwadih, Champigny sur Marne (FR)

(73) Assignees: Commissariat a l'energie atomique et aux energies alternatives, Paris (FR); ISORG, Grenoble (FR)

( * ) Notice: Subject to any disclaimer, the term of this patent is extended or adjusted under 35 U.S.C. 154(b) by 86 days.

(21) Appl. No.: 14/127,271

(22) PCT Filed: Jul. 4, 2012

(86) PCT No.: PCT/EP2012/063068
§ 371 (c)(1),
(2), (4) Date: Dec. 18, 2013

(87) PCT Pub. No.: WO2013/004746
PCT Pub. Date: Jan. 10, 2013

(65) Prior Publication Data
US 2014/0110696 A1    Apr. 24, 2014

(30) Foreign Application Priority Data

Jul. 4, 2011 (FR) ...................................... 11 56026

(51) Int. Cl.
*H01L 51/44* (2006.01)
*H01L 51/52* (2006.01)

(52) U.S. Cl.
CPC .......... *H01L 51/441* (2013.01); *H01L 51/5212* (2013.01); *Y02E 10/549* (2013.01)

(58) Field of Classification Search
CPC ....... H01L 51/441; H01L 51/42; H01L 51/44; H01L 51/5203
USPC ..................... 257/431, 461; 438/82
See application file for complete search history.

(56) References Cited

U.S. PATENT DOCUMENTS

| | | | |
|---|---|---|---|
| 2004/0027061 A1* | 2/2004 | Seo et al. ...................... | 313/504 |
| 2006/0292955 A1 | 12/2006 | Kang et al. | |
| 2010/0018581 A1 | 1/2010 | Shrotriya et al. | |
| 2010/0207112 A1 | 8/2010 | Fürst et al. | |
| 2011/0095266 A1 | 4/2011 | Hayden et al. | |

FOREIGN PATENT DOCUMENTS

| | | |
|---|---|---|
| DE | 10 2006 052 608 | 5/2008 |
| EP | 1 484 632 | 12/2004 |
| EP | 2 023 435 | 2/2009 |
| JP | 2000 231985 | 8/2000 |
| WO | 2005 106573 | 11/2005 |
| WO | 2008 001756 | 1/2008 |
| WO | 2011 070951 | 6/2011 |

OTHER PUBLICATIONS

International Search Report Issued Sep. 19, 2012 in PCT/EP12/063038 Filed Jul. 4, 2012.
Search Report issued Feb. 15, 2012 in French Patent Application No. 1156026 with English translation of categories of cited documents.
Andrea Pais, et al., "High-sensitivity, disposable lab-on-a-chip with thin-film organic electronics for fluorescence detection", Lab Chip, vol. 8, 2008, pp. 794-800.

* cited by examiner

*Primary Examiner* — Cheung Lee
*Assistant Examiner* — Stephen Bradley
(74) *Attorney, Agent, or Firm* — Oblon, McClelland, Maier & Neustadt, L.L.P.

(57) ABSTRACT

An organic photodiode, including a first electrode forming an anode, an active layer, a second electrode, and at least one third electrode, forming a capacitance with another electrode, to trap at least part of dark current or leakage current.

9 Claims, 4 Drawing Sheets

PHOTODIODE DEVICE CONTAINING A CAPACITOR FOR CONTROLLING DARK CURRENT OR LEAKAGE CURRENT

TECHNICAL FIELD AND PRIOR ART

The present invention relates to the field of organic photodetectors (OPD) or organic photoemitters (OLED) and more particularly addresses the problem of optimizing the efficiency of a detecting or emitting type photodiode.

Document US 2010/0207112 relates to the dark current ($I_{dark}$) of an OPD.

An OPD collects light rays (or photons) and converts them into an electrical current. A photon arriving onto an organic layer, called active layer, will be dissociated into an electron/hole pair. This electron/hole pair will be separated via the application of an external electric field and the electrons will be collected by the positive electrode and the holes by the negative electrode. To achieve optimum performance, a maximum of photons should be absorbed and converted into electron/hole pairs and a maximum of electrons and holes should be collected at the electrodes.

The most commonly used architecture is the vertical stack of organic and/or non-organic layers.

FIG. 1 shows such a structure of OPD:
- on a substrate 2 of glass lies a transparent layer 4 of ITO, acting as a first electrode, for example an anode; it has been for example made by spraying, in a deposit frame and it is used as a lower electrode,
- then, an electron injecting layer (EIL, for example of PDOT:PSS) is deposited for example by vacuum deposition,
- a mixture of n and p-type polymer (for example, of PBCM:P3HT) is called an active layer 6 (or volume heterojunction); this one has been for example deposited through deposit techniques such as spin-coating, spray-coating . . . ,
- a hole injection layer (HIL, for example of ZnO); it has been for example deposited by a so-called "spin-coating" technique,
- finally, a metal layer 10 is used as an upper electrode (or cathode); it has been for example deposited by a vacuum deposition technique, or even a printing technique.

In this type of architecture, at least one of both electrodes is transparent so as to enable light to be detected (anode or cathode).

There is also another structure, called horizontal architecture, illustrated in FIG. 2.

The anode 4 and cathode 10 electrodes are then on the same level, at the surface of the substrate 2 and the active layer 6 is provided on, and between, both of them.

Regardless of the structure contemplated, the active layer 6 can be made of "small molecules" (for example, TIPS (triisopropylsilylethynyl) molecules for the p-type, mixed with diimideperylene for the n-type), deposited through vacuum evaporation, or is of wet deposited (spin-coating, doctor-blading, ink-jet . . . ) polymeric material.

Generally, a photodiode is a semi-conducting component (n+p) for detecting a radiation of the optical field and transforming it into an electrical signal and, conversely, creating photons when it is subjected to an electrical voltage. A photodiode can for example include a heterojunction pn or even a double pin heterojunction.

The so-called dark current is the current passing through the photodiode, causing a non-zero signal, even in the absence of light at the input thereof. FIG. 7A represents the course, as a function of the voltage applied between the electrodes 4, 10, on the one hand of the detected current I and, on the other hand, of the dark current $I_{dark}$. The latter is generated by physical processes other than the absorption of photons to be detected. The performance of a photodiode is characterised by a current (I), under illumination, as high as possible and an $I_{dark}$ (or dark current) as low as possible.

The difference between the dark current and the current under illumination enables light to be detected. To optimize the fineness of this detection, it is attempted to minimize the dark current (without illumination).

In a similar way, when the photoemitter is not operating, stray light can light the device and create charges which will be undesirable, forming a leakage current.

There arises the problem of providing new means enabling dark current to be reduced in an OPD type photodetector or the leakage current in an OLED type photoemitter.

DISCLOSURE OF THE INVENTION

The present application describes a new type of organic photodiode, including a first electrode, an active layer, a second electrode and at least one third electrode, forming a capacitance with one of the first and second electrodes or with a $4^{th}$ electrode.

In other words, the capacitance can be formed between the first electrode and the third electrode, or between the second electrode and the third electrode, or even between a fourth electrode, distinct from the first and the second electrodes, and the third electrode.

Also described is an organic photodiode including a first electrode forming an anode, an active layer, a second electrode forming a cathode, and at least one third electrode forming a capacitance with another electrode corresponding to the first electrode or the second electrode or to a fourth electrode distinct from the first and the second electrodes. The thus formed capacitance enables at least part of a dark current ($I_{dark}$) or a leakage current ($I_{off}$) of the photodiode to be trapped. The organic photodiode further includes means for adjusting a voltage across said capacitance as a function of the dark current (for example, when the photodiode forms a photodetector) or the leakage current ($I_{off}$) (for example when the photodiode forms a photoemitter) one wishes to trap.

An additional capacitance is thus created to the device, using a further electrode, the third electrode, which enables at least one part of the undesirable charges of the dark current or the leakage current to be trapped. This further electrode plays the role of one of the plates of the additional capacitance. The other plate is either one of the already existing electrodes, or another further electrode.

When the photodiode is in a non-active mode, the additional capacitance, including the third electrode, is powered in order to block the moving charges of the dark current or the leakage current, which are present in the active layer and to prevent them from reaching the electrical circuit of the photodiode.

So a photodiode is described, comprising two electrodes and an active layer forming a detecting electrical circuit, characterised in that it comprises at least one $3^{th}$ electrode in the active layer making up one of the plates of an additional capacitance. This one is either off the detecting circuit, or in parallel to this circuit.

As a function of the level of the signal to be detected, the value of the additional capacitance can be adjusted, which enables the current $I_{dark}$ (dark current) or $I_{off}$ (=leakage current) to be modulated.

Different embodiments can be made; thus, a device according to the invention can include:

a substrate on which the first electrode and the second electrode are provided, the third electrode being also provided on this substrate (in other words, the three electrodes can be in contact with the substrate without touching each other), a substrate on which the first electrode is provided, for example in contact with said substrate, the second electrode being provided on the active layer, and at least the third electrode being provided in the active layer, between the first electrode and the second electrode, a fourth electrode, provided in the active layer, between the first electrode and the second electrode, this fourth electrode forming, with the third electrode, the capacitance to trap part of the dark current or leakage current.

Still alternatively, the third electrode can form, with the first electrode, or with the second electrode, the capacitance to trap part of the dark current or leakage current.

Regardless of the embodiment contemplated, in such a device, at least the third electrode can be encapsulated in a portion of the dielectric material, the dielectric constant of which is preferably between 2 and 4. This dielectric material can be for example polyvinyl phenol or polymethacrylate or polystyrene or silica or alumina.

DETAILED DISCLOSURE OF PARTICULAR EMBODIMENTS

The examples below will be described in the case of a photodetector, but they can readily be transposed to the case of a photoemitter.

Figure 1:
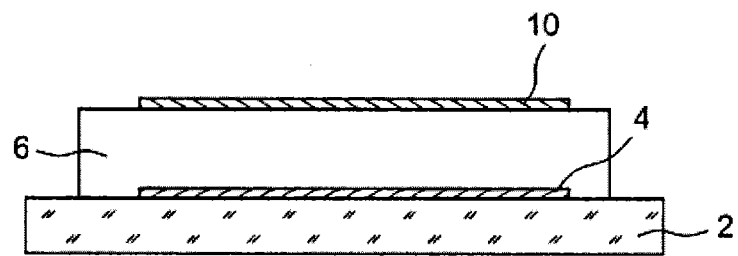
FIG. 1 represents a known OPD or OLED structure.
Figure 2:
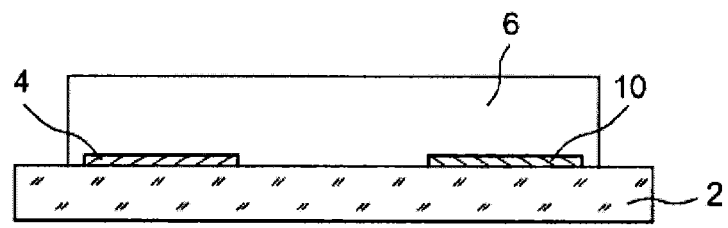
FIG. 2 represents another known so-called horizontal OPD or OLED structure.
Figure 3:
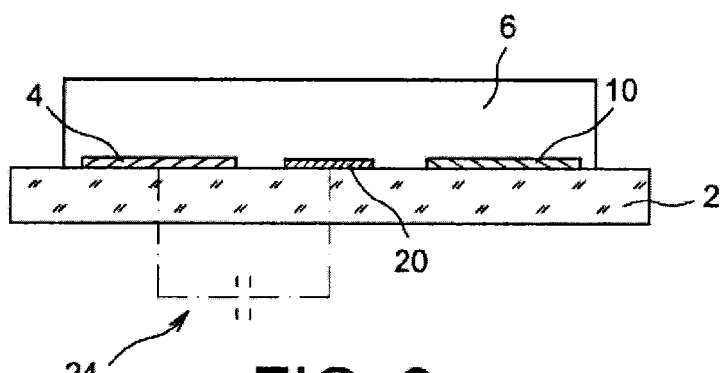
FIG. 3 represents a new OPD or OLED structure.

FIG. 3 represents a new OPD structure including a first electrode 4, a second electrode 10 both provided on a substrate 2. The latter can be rigid (of glass) or flexible (for example of polymer or metal).

An active layer 6 is provided between both electrodes 4, 10.

This active layer 6 is for example of a mixture of n and p-type polymer (for example of PBCM:P3Ht); this one has been for example deposited by deposit techniques such as spin-coating, spray-coating . . . .

This device can further include an electron injection layer (EIL, for example of PDOT:PSS) deposited for example through vacuum deposition and/or a hole injection layer (HIL, for example of ZnO); it has been for example deposited by a so-called "spin-coating" technique.

It is meant:
by PDOT:PSS, polyethylene dioxythiophene:polystyrene sulfonate,
by PBCM, Phenylbretiric acid ester,
by P3HT, Poly3-hexylthiophen.

One of the electrodes, intended to form the anode 4, can be of transparent material, for example of ITO but can also be of C nanotubes, or of conducting polymeric material. It is for example deposited through spraying in a deposit frame.

The other electrode, intended to form the cathode 10, can be deposited by vacuum evaporation. It can for example be of aluminium or of a mixture of lithium fluoride and aluminium.

A third electrode 20 is also provided on the substrate 2, between both electrodes 4, 10. This third electrode forms, with the first electrode 4, a capacitance symbolized in FIG. 3 by reference 24. The composition and/or the formation technique of this third electrode can be identical or similar to those of any other electrode.

Even though not represented in the figures (because these are cross-section views), there are connections connecting each of the electrodes to pads enabling them to be powered using supply means.

To control a dark current, this capacitance 24 is powered by applying a voltage across both electrodes 4, 20. This capacitance blocks the flow of at least part of the dark current, between the anode 4 and the cathode 10 of the OPD, by trapping charges of the active layer 6.

The value of the voltage applied across this capacitance 24 can be adapted, as a function of the dark current level in order to block it more or less efficiently (this does not contradict the assertion, hereinafter, that the voltages applied across this capacitance play a secondary role, because these voltages are very low, such that they do not disturb the operation under illumination).

Figure 4A:
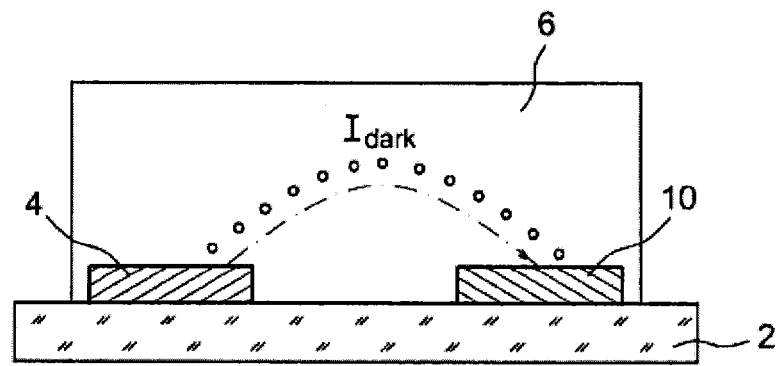
FIGS. 4A and 4B represent the operation of a new horizontal type OPD or OLED structure.

To illustrate the operation of such a device, in FIG. 4A, an OPD structure, of a known type, has been schematically represented, without the third electrode 20 described above. The dark current $I_{dark}$ flows from the anode 4 to the cathode 10.

Figure 4B:
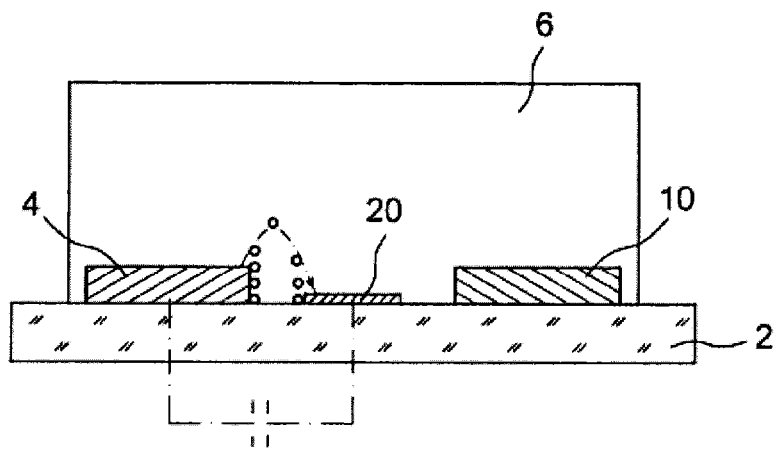

FIG. 4B schematically represents an OPD structure, with the third electrode 20, forming the structure described above. The dark current $I_{dark}$ flows from the anode 4 to the third electrode 20, and it does not reach the cathode 10. When an incident radiation is collected by the photodetector, the component of the dark current in the measured signal is reduced with respect to the case of FIG. 4A.

The architecture represented in FIG. 3 is of the horizontal type.

Figure 5A:
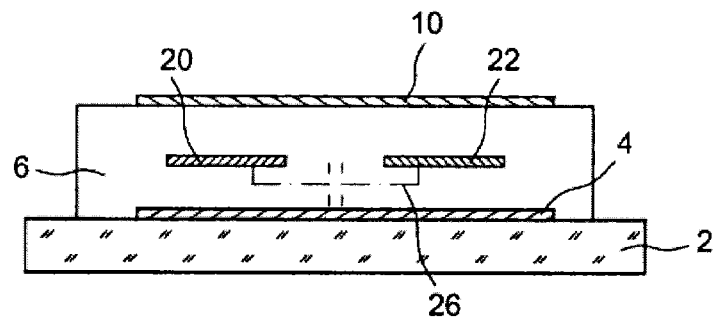
FIGS. 5A and 5B represent the operation of a new vertical type OPD or OLED structure.
Figure 5B:
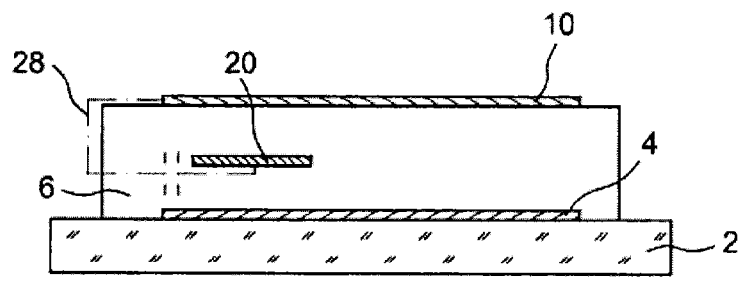

But a vertical architecture can also be implemented, as schematically represented in FIGS. 5A and 5B.

Both electrodes 4, 10 are provided on either side of the active layer 6, all of them resting on a substrate 2. The materials already indicated above for the electrodes and the active layer can also be used here.

In the structure of FIG. 5A, a third electrode 20 and a fourth electrode 22 are provided in the active layer 6, between the first electrode 4 and the second electrode 10 and are substantially parallel to the latter. Both these electrodes 20, 22 are further provided at substantially the same level in the active layer 6, that is there is substantially the same distance between each of them and each of both other electrodes 4, 10. Once again, the electrodes are connected to tracks and/or electrical pads, which enable them to be powered using voltage supply means.

These are both these inner electrodes 20, 22 of the active layer 6 that will then form a capacitance 26, which will allow at least part of the dark current $I_{dark}$ to be collected upon operating the device as a photodetector.

In the structure of FIG. 5B, a third electrode 20 is provided in the active layer 6, between the first electrode 4 and the second electrode 10 and substantially parallel to the latter. Once again, the electrodes are connected to tracks and/or electrical pads, which enable them to be powered using voltage supply means.

These are then both electrodes 10, 20 (or 4 and 20) which will form a capacitance 28, which will enable at least part of the dark current $I_{dark}$ to be collected upon operating the device as a photodetector.

In the examples that have been described above, it is the material of the active layer 6 which forms the material of the capacitance 24, 26 or 28, between both plates 4, 20 or 10, 20 or 20, 22 thereof.

Figure 6:
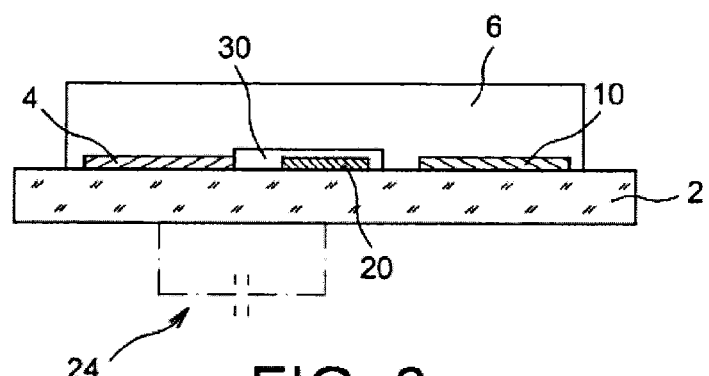
FIG. 6 represents a configuration wherein a capacitance with a dielectric is inserted into the active layer.

In an alternative of the horizontal type structure, represented in FIG. 6, the third electrode 20 is encapsulated in a dielectric layer 30, in turn coated with the active layer 6.

The same dark current collecting effect as above is achieved but, in this case, the dielectric material 30 enables the dielectric constant ϵ of the capacitance 22 to be adapted in order to improve the collection of charges in the active layers. For example:
if there is a layer of dielectric material 30 having a thickness e=50 nm with a dielectric constant ϵ=2, the capacitance will be low and will only attract a few charges,
if there is a layer of dielectric material 30 having a thickness e'=50 nm with a dielectric constant ϵ'=20, the amount of charges trapped by the capacitance will be greater than in the previous case and the efficiency of the system will also be improved.

A dielectric material 30 with a dielectric constant ϵ between 2 and 10 is preferably selected. Further preferably, a material having a good chemical affinity to the active layer 6 is selected, enabling wettability problems at the time of deposition to be avoided.

For example, as the dielectric material 30, PVP (polyvinylphenol), with ϵ=4 to 6, or PMMA (polymethacrylate), with ϵ=2.8 to 4.6, or polystyrene, with ϵ=3, or even silica, with ϵ=4 or alumina, with ϵ=8 can be used.

Generally, in a structure such as described above, a capacitance formed by at least one of the further electrodes 20, 22 acts as a brake to conduction.

Depending on the value of this capacitance, the level and the value of the dark current can be decreased or increased. This tends to be very interesting to adjust and obtain a desired detection threshold.

For example, the increasing values of the additional capacitance 24, 26, 28 can be used (for example, taking capacitances having increasing areas or increasing permittivity ϵ or applying increasing voltages) and the residual dark current can be modulated accordingly.

Figure 7A:
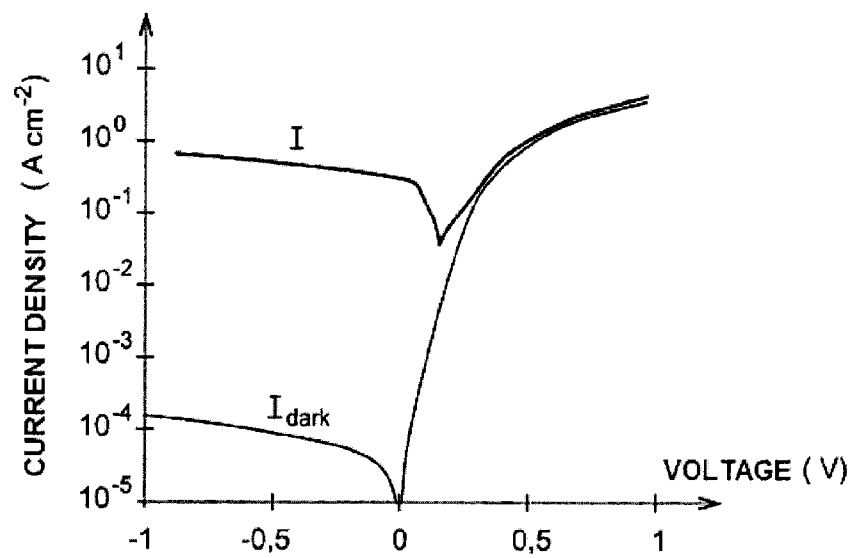
FIGS. 7A and 7B respectively represent the course of the signal measured and the dark (or leakage) current in an OPD type photodetector (of an OLED type photoemitter), of a known structure (FIG. 7A) and the course of the dark (or leakage) current as a function of the value of the additional capacitance in a photodiode according to the invention.
Figure 7B:
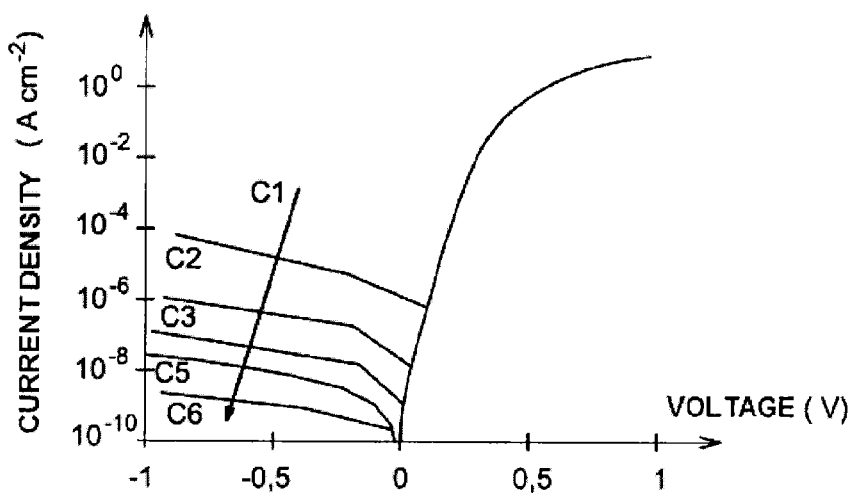

Thus, in FIG. 7B, is represented the course of the dark current, as a function of the voltage, for different capacitances $C_1$-$C_6$, the capacitance $C_i$ (i=2-6) being higher than the capacitance $C_{i-1}$. (for example: $C_1$=1 pF, $C_2$=2 pF; $C_3$=5 pF; $C_4$=10 pF; $C_5$=15 pF; $C_6$=20 pF). It is noticed that the dark current decreases with the increase in the capacitance value.

By comparison (FIG. 7A), the device of known type, without further electrode, has, for a given voltage, a single dark current which is not adjustable.

The dimensions of the plates of the capacitance 24, 26, 28 give the value of the desired capacitance C; indeed=ϵS/d (d=thickness, ϵ=permittivity of the dielectric forming material between the electrodes and S area of the plates).

In a structure such that of FIG. 3, 5B or 6, the further plate 20 is preferably placed very next to one of the electrodes 4, 10 (the electrode 4 in FIGS. 3 to 6; the electrode 10 in FIG. 5B) in order to cut off conduction between the electrodes 4, 10. The dimensions of the electrode 20 can vary. This can have for example a length, measured in a plane parallel to the surface of the substrate 2, of about one hundred µm (or for example between 50 µm and 500 µm) and a width, measured in the same plane parallel to the surface of the substrate 2, between a few micrometers and a few tens micrometers, for example between 1 µm and 50 µm, for example further equal to, or close to, 10 µm. These dimensions will be selected such that the electrode 20 can create, together with the electrode 4 or 10, a sufficient capacitance C. Typically, a capacitance value C of 1 pF to 50 pF can be used. The third electrode 20 (and/or the fourth electrode 22) can thus have an area of at least 50 µm². Advantageously, the electrodes have the form of fingers, so as to have as high as possible an area, which enables disturbances during elimination or emission of photons to be avoided. Their thickness will be as low as possible; for example, a thickness between 10 nm and 30 nm will be chosen, in particular for gold.

Each of the additional electrodes 20, 22 is preferably parallel to, or located in the same plane as, the electrode with which it will form the additional capacitance 24, 26 or 28. But, more generally, their relative position could be any position, with the proviso that they can form this additional capacitance.

The voltage applied between both electrodes of the capacitance plays a secondary role because it is very low relative to the voltages applied to the photodiode. An external voltage can thus be applied, for example between 1 mV and 1 volt (±1 V) whereas the diode will be subjected to, or will deliver, voltages between 1 V and 10 V.

Several additional capacitances can be used in a same photodiode, for example different voltage generators, but it is simpler to use only one capacitance per photodiode.

The invention claimed is:

1. An organic photodiode, comprising:
a first electrode forming an anode;
a second electrode forming a cathode;
an active layer provided between the first electrode and the second electrode;
at least one third electrode, the third electrode being provided in the active layer between the first electrode and the second electrode and being in contact neither with the first electrode nor with the second electrode, the third electrode forming with the first electrode or with the second electrode or with a fourth electrode distinct from the first and the second electrodes, plates of a capacitance to trap at least part of dark current or leakage current of the photodiode; and
means including tracks and/or pads enabling the third electrode and/or the fourth electrode to be powered using a voltage supply means, to apply a voltage across the capacitance, as a function of the dark current or the leakage current.

2. The device according to claim 1, further comprising a substrate on which the first electrode, the second electrode, and the third electrode are provided.

3. The device according to claim 1, further comprising a substrate on which the first electrode is provided, the second electrode being provided on the active layer.

4. The device according to claim 3, further comprising the fourth electrode provided in the active layer, between the first electrode and the second electrode, the fourth electrode forming, with the third electrode, the capacitance to trap part of the dark current or the leakage current.

5. The device according to claim 1, a material between plates of the capacitance being a material of the active layer.

6. The device according to claim 1, at least the third electrode being encapsulated in a portion of dielectric material.

7. The device according to claim 6, the dielectric constant of the dielectric material being higher than 2 and lower than 10.

8. The device according to claim 6, the dielectric material being polyvinyl phenol or polymethacrylate or polystyrene or silica or alumina.

9. The device according to claim 1, the active layer being a mixture of n and p-type layer.

\* \* \* \* \*

UNITED STATES PATENT AND TRADEMARK OFFICE
CERTIFICATE OF CORRECTION

PATENT NO. : 9,142,789 B2  
APPLICATION NO. : 14/127271  
DATED : September 22, 2015  
INVENTOR(S) : Benwadih Page 1 of 1

It is certified that error appears in the above-identified patent and that said Letters Patent is hereby corrected as shown below:

On the title page, Item (86), should read:

--(86) PCT No.: PCT/EP2012/063038

§ 371 (c)(1),
(2),(4) Date: Dec. 18, 2013--

Signed and Sealed this
Twenty-second Day of March, 2016

Michelle K. Lee
*Director of the United States Patent and Trademark Office*